(12) United States Patent
Chang

(10) Patent No.: US 9,653,616 B2
(45) Date of Patent: May 16, 2017

(54) DISPLAY PANEL AND DISPLAY DEVICE USING THE SAME

(71) Applicant: Innolux Corporation, Chu-Nan (TW)

(72) Inventor: Ming-Chieh Chang, Chu-Nan (TW)

(73) Assignee: INNOLUX CORPORATION, Chu-Nan (TW)

( * ) Notice: Subject to any disclaimer, the term of this patent is extended or adjusted under 35 U.S.C. 154(b) by 354 days.

(21) Appl. No.: 14/552,577

(22) Filed: Nov. 25, 2014

(65) Prior Publication Data

US 2015/0155393 A1 Jun. 4, 2015

(30) Foreign Application Priority Data

Dec. 2, 2013 (TW) .............................. 102144112 A

(51) Int. Cl.
| | |
|---|---|
| H01L 29/786 | (2006.01) |
| G02F 1/1368 | (2006.01) |
| H01L 27/32 | (2006.01) |
| H01L 29/417 | (2006.01) |
| H01L 27/12 | (2006.01) |

(52) U.S. Cl.
CPC ...... *H01L 29/78696* (2013.01); *H01L 27/124* (2013.01); *H01L 27/1225* (2013.01); *H01L 27/3276* (2013.01); *H01L 29/41733* (2013.01); *H01L 29/78693* (2013.01); *G02F 2001/13685* (2013.01); *H01L 27/3248* (2013.01)

(58) Field of Classification Search
CPC ............. H01L 27/3248; H01L 27/3276; H01L 29/41733; H01L 29/78693; H01L 29/78696

See application file for complete search history.

(56) References Cited

U.S. PATENT DOCUMENTS 5,372,958 A * 12/1994 Miyasaka ........... H01L 21/3003
148/DIG. 150
6,509,939 B1 * 1/2003 Lee ................... G02F 1/134363
349/110

(Continued)

FOREIGN PATENT DOCUMENTS

| TW | 200722844 A | 6/2007 |
| TW | 201338102 A1 | 9/2013 |

OTHER PUBLICATIONS

Taiwanese Office Action dated Apr. 29, 2015.

*Primary Examiner* — Bradley K Smith
*Assistant Examiner* — David Goodwin
(74) *Attorney, Agent, or Firm* — Rabin & Berdo, P.C.

(57) ABSTRACT

A display panel comprising a TFT substrate, a display medium and an opposite substrate is provided. The display medium is disposed between the TFT substrate and the opposite substrate. The TFT substrate comprises a substrate, a first electrode layer, a pixel electrode layer, a first insulating layer, a second electrode layer, a second insulating layer, a channel layer and an over coating layer. The first electrode layer and the pixel electrode layer are disposed on the substrate. The first insulating layer is disposed on the first electrode layer and the pixel electrode layer. The second electrode layer is disposed on the first insulating layer. The second insulating layer is disposed on the second electrode layer. The channel layer is interposed into a first contact hole and a second contact hole to electrically connect the first electrode layer. The over coating layer is disposed on the channel layer.

18 Claims, 9 Drawing Sheets

(56) References Cited

U.S. PATENT DOCUMENTS

| | | | |
|---|---|---|---|
| 8,021,916 B2* | 9/2011 | Akimoto | H01L 27/1225 257/E21.461 |
| 2002/0180901 A1* | 12/2002 | Kim | G02F 1/136213 349/43 |
| 2006/0208253 A1* | 9/2006 | Kim | H01L 51/0003 257/40 |
| 2008/0143902 A1* | 6/2008 | Ku | G02F 1/13394 349/38 |
| 2009/0065771 A1* | 3/2009 | Iwasaki | H01L 29/78618 257/43 |
| 2010/0224880 A1* | 9/2010 | Kimura | H01L 27/1225 257/59 |
| 2011/0220906 A1* | 9/2011 | Huang | H01L 27/1225 257/72 |
| 2012/0319104 A1* | 12/2012 | Hara | H01L 27/1225 257/43 |
| 2014/0110715 A1* | 4/2014 | Lai | H01L 27/156 257/59 |

\* cited by examiner

DISPLAY PANEL AND DISPLAY DEVICE USING THE SAME

This application claims the benefit of Taiwan application Serial No. 102144112, filed Dec. 2, 2013, the subject matter of which is incorporated herein by reference.

BACKGROUND OF THE INVENTION

Field of the Invention

The invention relates in general to a display panel and a display device using the same, and more particularly to a display panel with an oxide semiconductor top channel, and a display device using the same.

Description of the Related Art

The material of thin-film transistor (TFT) channel commonly used in display panel comprises poly-silicon and amorphous silicon (a-Si). The poly-silicon TFT component has a higher mobility (>100 Vs/cm$^2$) but has a higher manufacturing cost, too. To the contrary, the a-Si TFT component has a lower manufacturing cost but has a lower mobility (<1 Vs/cm$^2$), too.

The oxide semiconductor formed by amorphous indium gallium zinc oxide (a-IGZO), which possesses excellent electrical properties (for example, the mobility is between 10-20 Vs/cm$^2$, the small diversity of the threshold voltage, and the switching function) and can be used as an electron channel layer, has attracted considerable attention. When forming a channel layer, current TFT design (for example, the bottom-gate design such as back channel etching (BCE) and a channel protection (CHP), and the top-gate design such as low temperature poly-silicon (LTPS)) requires an extra manufacturing step such as a chemical vapor deposition (CVD) process and a plasma process. These extra processes may cause oxygen deficiency to the oxide semiconductor. Oxygen deficiency makes the starting voltage (Vgh) drift or the sub-threshold swing (SS) become too large, hence affecting the properties of electron channel of the oxide semiconductor.

SUMMARY OF THE INVENTION

The invention is directed to a display panel and a display device using the same, and the electron channel layer of the display panel has excellent characters.

According to one embodiment of the present invention, a display panel is provided. The display panel comprises a TFT substrate, a display medium and an opposite substrate. The display medium is disposed between the TFT substrate and the opposite substrate. The TFT substrate comprises a substrate, a first electrode layer, a pixel electrode layer, a first insulating layer, a second electrode layer, a second insulating layer, a channel layer and an over coating layer. The first electrode layer and the pixel electrode layer are disposed on the substrate. The first insulating layer is disposed on the first electrode layer and the pixel electrode layer. The second electrode layer is disposed on the first insulating layer. The second insulating layer is disposed on the second electrode layer. The second insulating layer has a first contact hole and a second contact hole. The first contact hole and the second contact hole penetrate the first insulating layer and the second insulating layer to expose the first electrode layer. The channel layer is disposed on the second insulating layer and interposed into the first and the second contact holes to electrically connect the first electrode layer. The over coating layer is disposed on the channel layer.

According to another embodiment of the present invention, a display device is provided. The display device comprises a display panel and a control circuit. The control circuit is coupled to the display panel. The display panel comprises a TFT substrate, a display medium and an opposite substrate. The display medium is disposed between the TFT substrate and the opposite substrate. The TFT substrate comprises a substrate, a first electrode layer, a pixel electrode layer, a first insulating layer, a second electrode layer, a second insulating layer, a channel layer and an over coating layer. The first electrode layer and the pixel electrode layer are disposed on the substrate. The first insulating layer is disposed on the first electrode layer and the pixel electrode layer. The second electrode layer is disposed on the first insulating layer. The second insulating layer is disposed on the second electrode layer. The second insulating layer has a first contact hole and a second contact hole. The first contact hole and the second contact hole penetrate the first insulating layer and the second insulating layer to expose the first electrode layer. The channel layer is disposed on the second insulating layer and interposed into the first contact hole and the second contact hole to electrically connect the first electrode layer. The over coating layer is disposed on the channel layer.

Through the design of disposing the channel layer at the top of the TFT substrate, the display panel and the display device of the invention can avoid the characters of the channel layer being damaged so as to maintain excellent electrical properties and enhance display quality.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
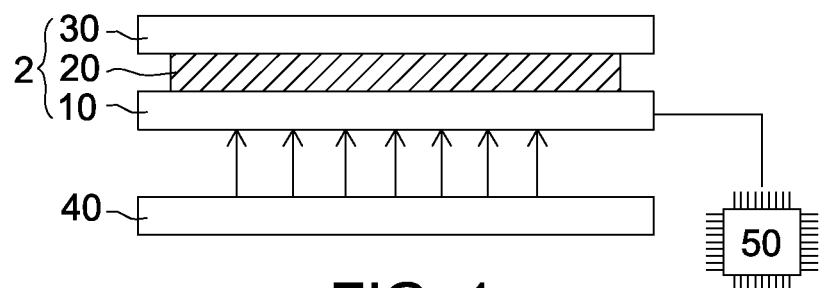
FIG. 1 is a schematic diagram of a display device according to an embodiment of the invention.

Referring to FIG. 1, a schematic diagram of a display device according to an embodiment of the invention is shown. The display device 1 can be realized by an ordinary flat-panel display composed of a display panel 2 and a control circuit 50. The control circuit 50 is coupled to the display panel 2 and is used for transmitting display signals and adjusting the output of current. The display panel 1 can be classified self-luminous type display panel (such as OLED) and backlight type display panel (such as LCD) according to whether or not an external light source is required. When the display panel 2 is a backlight type display panel, the display device 1 may comprise a backlight module 40 which provides a necessary light source.

The display panel 2, being a main component of the display device 1, comprises a TFT substrate 10, a display medium 20 and an opposite substrate 30. The TFT substrate 20 is coupled to the control circuit 50 and is used for adjusting the pixels according to the received display signals. The display medium 20 is various according to the display panel. For example, when the display panel 2 is an LCD panel, the display medium 20 is a liquid crystal layer; when the display panel 2 is an OLED panel, the display medium 20 is an organic light emitting layer. The opposite substrate 30, which can be an ordinary transparent substrate or a color filter substrate, is opposite to the TFT substrate 10. The display medium 20 is disposed between the TFT substrate 10 and the opposite substrate 30. In an embodiment, when the opposite substrate 30 is a transparent substrate, a color filter can be formed on the TFT substrate 10, or, the display medium 20 can have color display function.

Figure 2A:
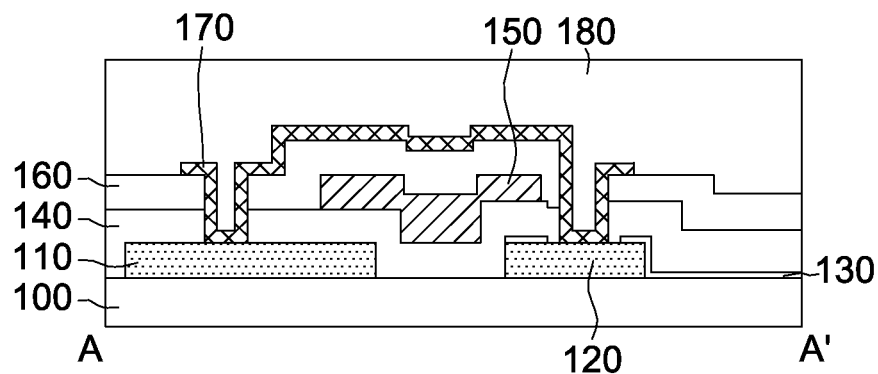
FIG. 2A is a cross-sectional view of a TFT substrate according to an embodiment of the invention.
Figure 2B:
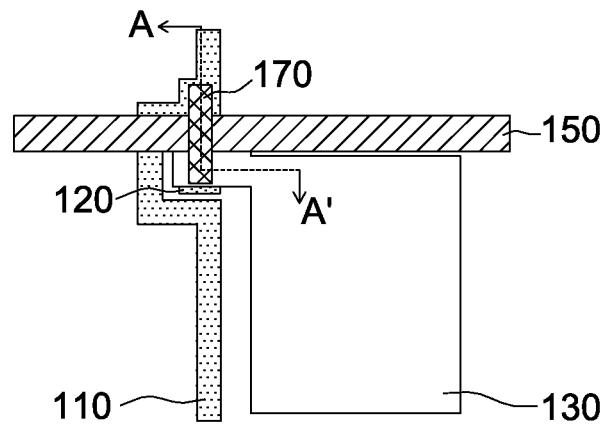
FIG. 2B is a top view of the TFT substrate of FIG. 2A.

FIG. 2A is a cross-sectional view of a TFT substrate according to an embodiment of the invention. FIG. 2B is a top view of the TFT substrate of FIG. 2A. FIG. 2A is a cross-sectional view of the TFT substrate 10 of FIG. 2B along a dotted line A-A'. To make the drawing more clearly, some components of FIG. 2B are omitted. The TFT substrate 10 comprises a substrate 100, a first electrode layer (first source/drain 110 and second source/drain 120), a pixel electrode layer 130, a first insulating layer 140, a second electrode layer 150, a second insulating layer 160, a channel layer 170 and an over coating layer 180.

An embodiment of The manufacturing process of the TFT substrate of FIG. 2A are disclosed below with accompanying drawings FIG. 3A to FIG. 8B, wherein the drawings with designation A are cross-sectional views, and the drawings with designation B are top views.

Figure 3A:
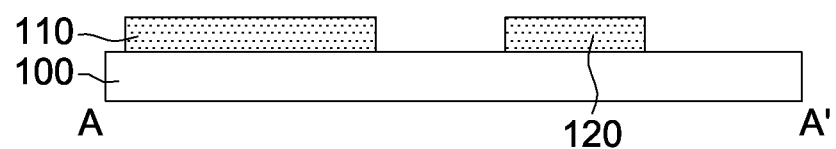
FIGS. 3A-8B are an embodiment of manufacturing the TFT substrate of FIG. 2A, wherein the drawings with designation A are cross-sectional views, and the drawings with designation B are top views.
Figure 3B:
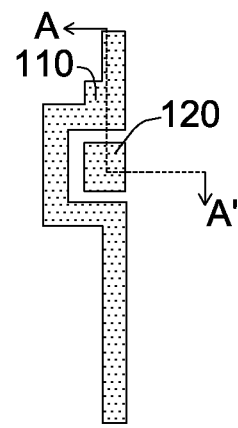

As indicated in FIGS. 3A and 3B, a substrate 100 (omitted in FIG. 3B) is provided, and a patterned first electrode layer is formed on the substrate 100. It should be noted that the cross-section of FIG. 3A is obtained along an L-shaped dotted line A-A' of FIG. 3B, not a straight line. The first electrode layer at least comprises a first source/drain 110 and a second source/drain 120. The first source/drain 110 and the second source/drain 120 are separated from each other. Here, the first source/drain 110 forms a C-shaped recess inside which the second source/drain 120 is located. That is, the first source/drain 110 bypasses the second source/drain 120. The first source/drain 110 can be used as a data line. The first electrode layer can be made of material such as Al, Al—Nd, MoW, Cu, Cr, Au, Mo, and MoAlMo. However, the material of the first electrode layer is not limited thereto, and any material used in the electrode of a semiconductor device would also do.

Figure 4A:
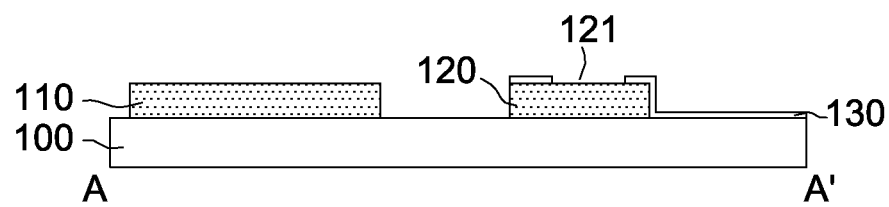
Figure 4B:
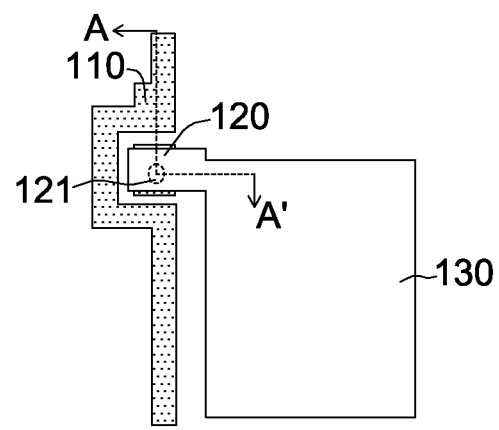

Next, as indicated in FIG. 4A and FIG. 4B, a pixel electrode layer 130 is formed. The pixel electrode layer 130 and the second source/drain 120 of the first electrode layer are interconnected. In addition, an opening 121 penetrating the pixel electrode layer 130 to expose the source/drain 120. The pixel electrode layer is a transparent electrode, and can be made of material comprising such as ITO, IZO and ZnO, but the material of the pixel electrode layer is not limited thereto.

Figure 5A:
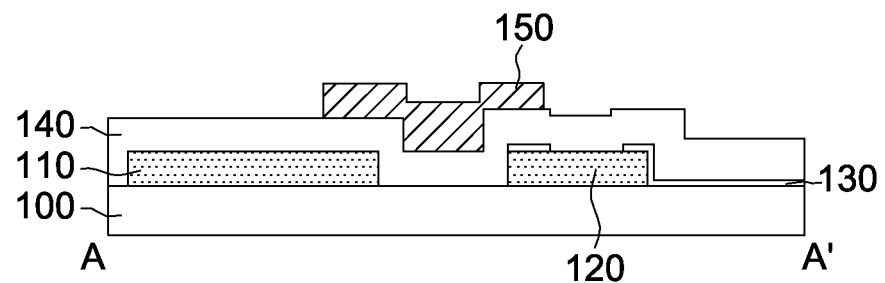
Figure 5B:
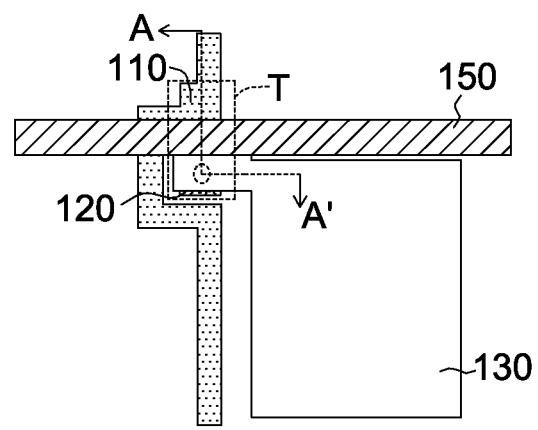

Then, as indicated in FIG. 5A and FIG. 5B, a first insulating layer 140 (omitted in FIG. 5B) is deposited to covers the TFT substrate (that is, to cover the substrate 110, the first source/drain 110, the second source/drain 120 and the pixel electrode layer 130), and then a second electrode layer 150 is formed. The second electrode layer 150, which can be a gate line, is disposed on the first insulating layer and located between the first source/drain 110 and the second source/drain 120 (FIG. 5A). The extending direction of the second electrode layer 150 is perpendicular to that of the first source/drain 110 (FIG. 5B), and the portion of the second electrode layer 150 crossing the first source/drain 110 and the second source/drain 120 can be used as a gate of a TFT component. That is, the second electrode layer 150 of FIG. 5A is used as a gate which forms a TFT component together with the first source/drain 110 and the second source/drain 120. The TFT component, indicated by a dotted frame T of FIG. 5B, is disposed at an intersection between the first source/drain 110 (the data line) and the second electrode layer 150 (the gate line). Therefore, the TFT substrate of the present embodiment does not require extra space for disposing the TFT component, and the aperture ratio of the display panel can thus be increased. The first insulating layer 140 can be made of material comprising such as $SiN_x$, $SiO_xN_x$, $AlO_x$ and $SiO_x$. The second electrode layer 150 can be made of material identical to that of the first electrode layer (the first source/drain 110 and the second source/drain 120), that is, comprising Al, Al—Nd, MoW, Cu, Cr, Au, Mo, and MoAlMo, or can be made of material different from that of the first electrode layer, and the invention does not restrict the material used.

Figure 6A:
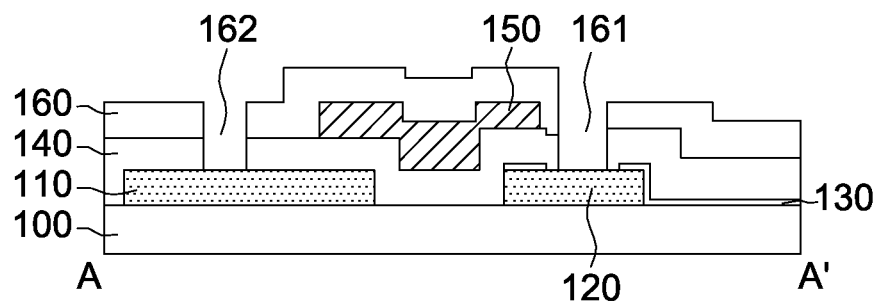
Figure 6B:
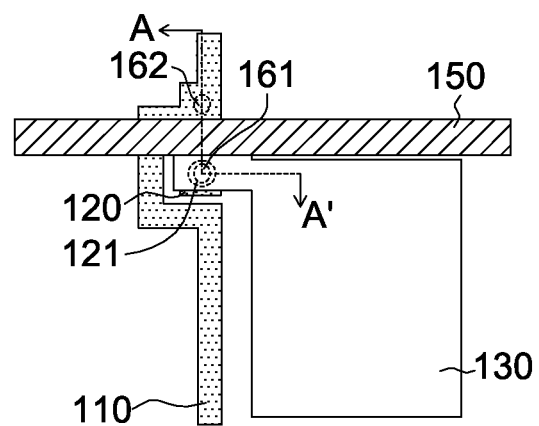

Then, as indicated in FIG. 6A and FIG. 6B, a second insulating layer 160 (omitted in FIG. 6B) covering the TFT substrate (the first insulating layer 140 and the second electrode layer 150) is formed. The second insulating layer 160 is mainly used as a gate insulator (GI) for insulating the gate line (the second electrode layer 150) from other structures. Then, photoresist (not illustrated) is used as a mask for defining a first contact hole 161 and a second contact hole 162. The first contact hole 161 and the second contact hole 162 both penetrate the first insulating layer 140 and the second insulating layer 160. The first contact hole 161 exposes the second source/drain 120, while the second contact hole 162 exposes the first source/drain 110. It should be noted that the diameter of the first contact hole 161 is smaller than that of the opening 121 of FIG. 4A which penetrates the pixel electrode layer 130, and the first contact hole 161 is disposed inside the opening 121 (FIG. 6B) to avoid the first contact hole 161 exposing the pixel electrode layer 130. The second insulating layer 160 can be made of material such as $SiN_x$, $SiO_xN_x$, $AlO_x$, $SiO_x$ and $TiO_x$, but the material of the second insulating layer 160 is not limited thereto.

Figure 7A:
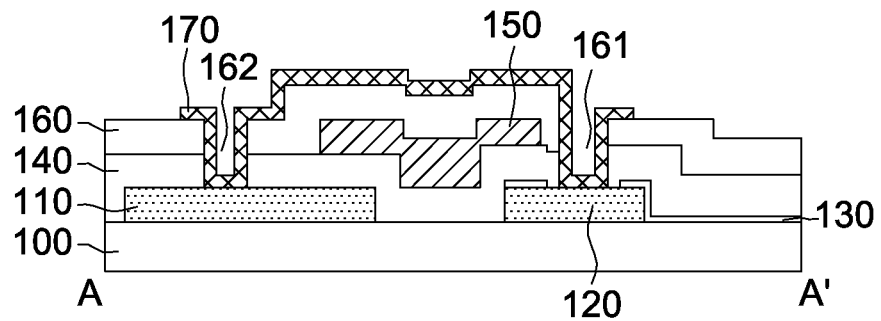
Figure 7B:
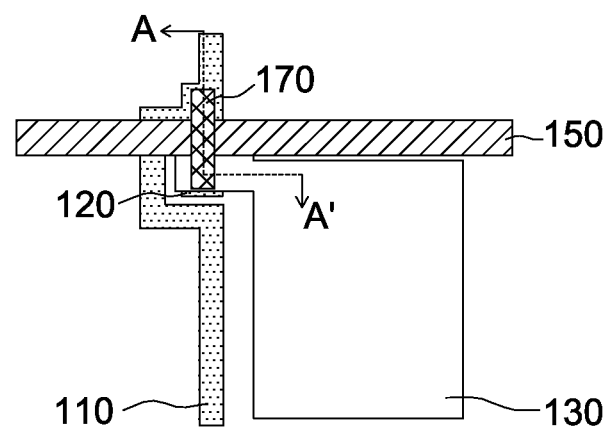

Then, as indicated in FIG. 7A and FIG. 7B, a channel layer 170 is formed. The channel layer 170 can be disposed on the second insulating layer 160 or disposed on a TFT component composed of the first source/drain 110, the second source/drain 120 and a portion of the second electrode layer 150 (used as a gate). The channel layer 170 is interposed into the first contact hole 161 and the second contact hole 162 for electrically connecting the second source/drain 120 and the first source/drain 110 respectively but electrically insulating the pixel electrode layer 130 and the second electrode layer 150 used as a gate. As indicated in FIG. 7B, the extended direction of the channel layer 170 is perpendicular to that of the second electrode layer 150 (the direction of the gate line) but parallel with that of the first source/drain 110 (the direction of the data line). The channel layer 170 is disposed at an intersection between the data line 110 and the gate line 150. Since the channel layer 170 is designed to be perpendicular to the second electrode layer 150 (the gate line), the channel layer of the present embodiment only needs to be aligned with the source/drain and does not need to be aligned with the gate, so that the alignment step can be omitted and the required precision of manufacturing process can be reduced. The channel layer can be made of the material of the oxide semiconductor such as a-IGZO and a-IZO.

Figure 8A:
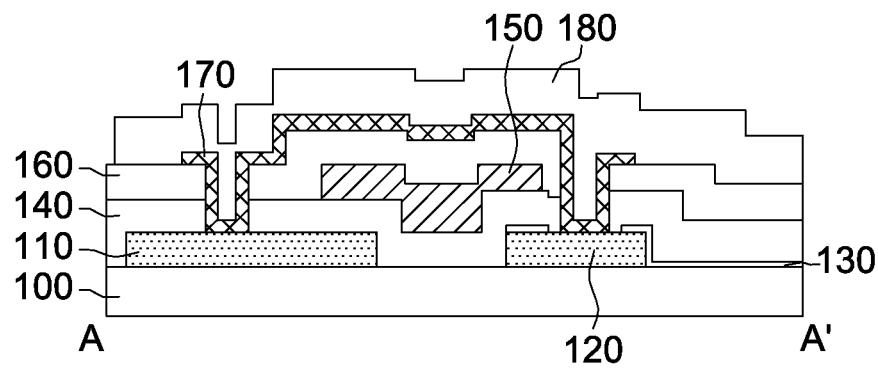
Figure 8B:
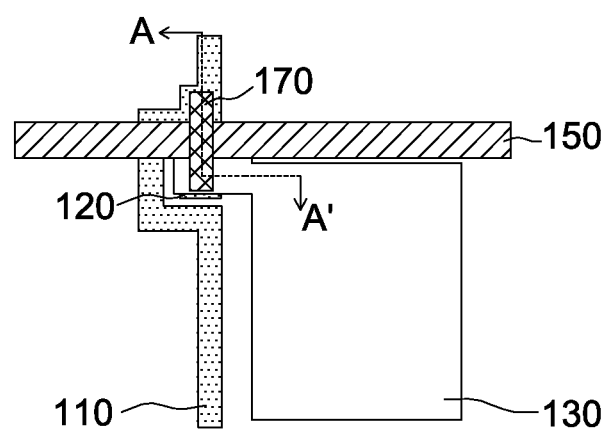

Lastly, as indicated in FIG. 8A and FIG. 8B, an over coating layer 180 (omitted in FIG. 8B) is formed on the channel layer 170, and the TFT substrate 10 is completed. The thickness of the over coating layer 180 can be adjusted according to the needs in the manufacturing process. The surface of the over coating layer 180 can be leveled and smoothed by using such as a chemical mechanic polishing (CMP) process as indicated in FIG. 2A. The over coating layer 180 can be formed by a simple manufacturing step. For example, the over coating layer 180 can be formed by pre-baking or hot baking an organic material. The pre-baking temperature is between 70-80° C., and the hot baking temperature is 100° C. In comparison to the working temperature of the chemical vapor deposition CVD process or the plasma process which is higher than 300° C., the formation of the over coating layer 180 does not jeopardize electrical properties of the channel layer 170 and further avoids the channel layer 170 being exposed.

Figure 9A:
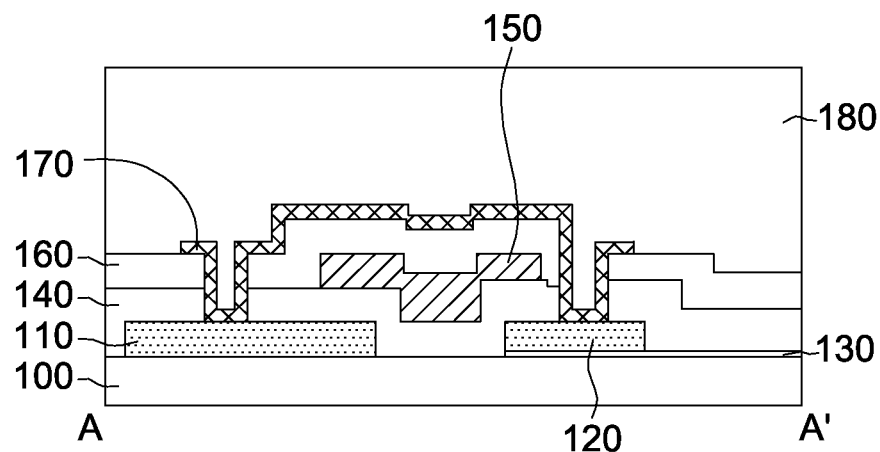
FIG. 9A is a cross-sectional view of a TFT substrate according to another embodiment of the invention.
Figure 9B:
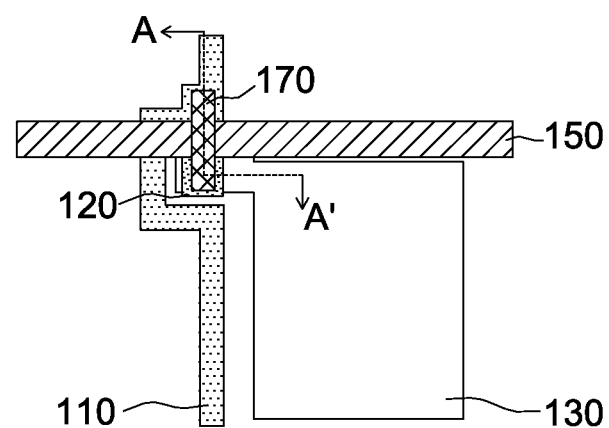
FIG. 9B is a top view of the TFT substrate of FIG. 9A.

FIG. 9A is a cross-sectional view of a TFT substrate according to another embodiment of the invention. FIG. 9B is a top view of the TFT substrate of FIG. 9A. The TFT substrate 11 is similar to the TFT substrate 10 of FIGS. 2A and 2B except for the location of the pixel electrode layer 130, and the similarities of other structures are not repeated.

As indicated in FIG. 9A, the pixel electrode layer 130 is formed prior to the formation of the first electrode layer (the first source/drain 110 and the second source/drain 120) and is disposed between the second source/drain 120 and the substrate 100 and electrically connected to the second source/drain 120. Since the pixel electrode layer 130 is disposed under the second source/drain 120, there is no need to have a contact hole (such as the opening 121 of FIGS. 4A and 4B) on the pixel electrode layer 130 or align the opening 121 with the first contact hole 161 like the manufacturing process indicated in FIG. 6A and 6B. By doing so, the alignment precision required in the manufacturing process can be reduced, the manufacturing cost can be reduced and the yield rate can be increased.

According to the display panel and the display device using the same disclosed in above embodiments, the channel layer of the TFT substrate is disposed at the top of the structure and is isolated by an over coating layer to avoid the component properties of the channel layer being jeopardized, such that excellent electrical properties can be maintained. The channel layer and the gate line are parallel to each other according to the generally known design such as the bake channel etching (BCE) and the channel protection (CHP), but are perpendicular to each other according to the embodiments of the invention. Therefore, the alignment precision required in the manufacturing process can be reduced, the manufacturing cost can be reduced and the yield rate can be increased. Furthermore, since the TFT component of the embodiment is disposed at an intersection between the data line and the gate line of the TFT substrate and does not require extra disposition space, the overall aperture ration of the display panel can be increased.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display panel, comprising:
    a TFT (thin-film transistor) substrate, comprising:
        a substrate;
        a first electrode layer disposed on the substrate;
        a pixel electrode layer disposed on the substrate;
        a first insulating layer disposed on the first electrode layer and the pixel electrode;
        a second electrode layer disposed on the first insulating layer;
        a second insulating layer disposed on the second electrode layer and having a first contact hole and a second contact hole, wherein the first contact hole and the second contact hole penetrate the first insulating layer and the second insulating layer to expose the first electrode layer;
        a channel layer disposed on the second insulating layer and interposed into the first contact hole and the second contact hole to electrically connect the first electrode layer; and
        an over coating layer disposed on the channel layer;
    an opposite substrate; and
    a display medium disposed between the TFT substrate and the opposite substrate.

2. The display panel according to claim 1, wherein the first electrode layer comprises a first source/drain and a second source/drain, the first source/drain is a portion of a data line, and the second electrode layer is a gate line.

3. The display panel according to claim 2, wherein the pixel electrode layer is electrically connected to the second source/drain and disposed between the second source/drain and the first insulating layer.

4. The display panel according to claim 3, wherein the pixel electrode layer has an opening exposing the second source/drain.

5. The display panel according to claim 4, wherein the first contact hole is disposed inside the opening.

6. The display panel according to claim 2, wherein the pixel electrode layer is electrically connected to the second source/drain and disposed between the substrate and the second source/drain.

7. The display panel according to claim 2, wherein the channel layer is disposed at an intersection between the data line and the gate line.

8. The display panel according to claim 1, wherein the channel layer is made of indium gallium zinc oxide (IGZO) or indium zinc oxide (IZO).

9. The display panel according to claim 1, wherein the display medium is a liquid crystal layer or an organic light emitting layer.

10. A display device, comprising:
    a display panel, comprising:
        a TFT substrate, comprising:
            a substrate;
            a first electrode layer disposed on the substrate;
            a pixel electrode layer disposed on the substrate;
            a first insulating layer disposed on the first electrode layer and the pixel electrode layer;
            a second electrode layer disposed on the first insulating layer;
            a second insulating layer disposed on the second electrode layer and having a first contact hole and a second contact hole, wherein the first contact hole and the second contact hole penetrate the first insulating layer and the second insulating layer to expose the first electrode layer;

a channel layer disposed on the second insulating layer and interposed into the first contact hole and the second contact hole to electrically connect the first electrode layer; and an over coating layer disposed on the channel layer;

an opposite substrate; and a display medium disposed between the TFT substrate and the opposite substrate; and a control circuit coupled to the display panel.

11. The display device according to claim 10, wherein the first electrode layer comprises a first source/drain and a second source/drain, the first source/drain is a portion of a data line, and the second electrode layer is a gate line.

12. The display device according to claim 11, wherein the pixel electrode layer is electrically connected to the second source/drain and disposed between the second source/drain and the first insulating layer.

13. The display device according to claim 12, wherein the pixel electrode layer has an opening exposing the second source/drain.

14. The display device according to claim 13, wherein the first contact hole is disposed inside the opening.

15. The display device according to claim 11, wherein the pixel electrode layer is electrically connected to the second source/drain and disposed between the substrate and the second source/drain.

16. The display device according to claim 11, wherein the channel layer is disposed at an intersection between the data line and the gate line.

17. The display device according to claim 10, wherein the channel layer is made of indium gallium zinc oxide (IGZO) or indium zinc oxide (IZO).

18. The display device according to claim 10, wherein the display medium is a liquid crystal layer or an organic light emitting layer.

* * * * *